United States Patent
Lenahan

(10) Patent No.: US 8,572,545 B1
(45) Date of Patent: Oct. 29, 2013

(54) METHODS AND MECHANISMS FOR EXTRACTING AND REDUCING CAPACITOR ELEMENTS

(75) Inventor: Terrence A. Lenahan, Holly Springs, NC (US)

(73) Assignee: Cadence Design Systems, Inc., San Jose, CA (US)

( * ) Notice: Subject to any disclaimer, the term of this patent is extended or adjusted under 35 U.S.C. 154(b) by 903 days.

(21) Appl. No.: 12/119,290

(22) Filed: May 12, 2008

Related U.S. Application Data

(62) Division of application No. 10/902,921, filed on Jul. 30, 2004, now Pat. No. 7,373,620.

(60) Provisional application No. 60/491,934, filed on Aug. 1, 2003.

(51) Int. Cl.
*G06F 17/50* (2006.01)

(52) U.S. Cl.
USPC .................................. 716/136; 716/139

(58) Field of Classification Search
USPC .................. 716/136, 119–120, 139
See application file for complete search history.

(56) References Cited

U.S. PATENT DOCUMENTS

| | | | |
|---|---|---|---|
| 5,202,841 A | 4/1993 | Tani | |
| 5,369,594 A | 11/1994 | Huang et al. | |
| 5,838,594 A | 11/1998 | Kojima | |
| 5,903,469 A | 5/1999 | Ho | |
| 5,999,726 A * | 12/1999 | Ho | 716/112 |
| 6,061,508 A | 5/2000 | Mehrotra | |
| 6,154,716 A | 11/2000 | Lee | |
| 6,185,722 B1 | 2/2001 | Darden et al. | |
| 6,209,122 B1 * | 3/2001 | Jyu et al. | 716/113 |
| 6,363,516 B1 * | 3/2002 | Cano et al. | 716/115 |
| 6,421,814 B1 * | 7/2002 | Ho | 716/113 |
| 6,477,686 B1 | 11/2002 | Dewey et al. | |
| 6,618,846 B2 | 9/2003 | Cheng | |
| 6,643,831 B2 | 11/2003 | Chang et al. | |
| 6,687,658 B1 | 2/2004 | Roychowdhury | |
| 6,763,504 B2 | 7/2004 | Rao et al. | |
| 6,779,164 B2 | 8/2004 | Ohba et al. | |
| 6,865,727 B2 | 3/2005 | Freichs et al. | |
| 6,925,619 B2 * | 8/2005 | Teng et al. | 716/115 |
| 6,961,915 B2 | 11/2005 | Loh et al. | |

(Continued)

OTHER PUBLICATIONS

Chen, Y. et al. "Area Fill Synthesis for Uniform Layout Density" IEEE Transactions on Computer-Aided Design of Integrated Circuits and Systems, Oct. 2002, vol. 21, No. 10, pp. 1132-1147.

(Continued)

*Primary Examiner* — Binh Tat
(74) *Attorney, Agent, or Firm* — Vista IP Law Group, LLP

(57) ABSTRACT

A method of extracting capacitance from a layout record includes imposing voltages on conductors in a layout record, and determining a total charge for each of the conductors to obtain a capacitor element for the conductors. A method of extracting capacitance from a layout record includes matching a configuration of conductors in a layout record against a reference pattern, and determining an extracted capacitance for the conductors based at least in part on the reference pattern. A method of extracting capacitance from a layout record includes providing a layout record of a circuit design, the layout record having data representing conductors and metal fill, and extracting capacitance to determine a set of capacitors between the conductors, the set of capacitors accounting for the metal fill.

10 Claims, 4 Drawing Sheets

(56) References Cited

U.S. PATENT DOCUMENTS

| | | | |
|---|---|---|---|
| 6,971,078 | B2 | 11/2005 | Ohba et al. |
| 2002/0104063 | A1 | 8/2002 | Chang et al. |
| 2002/0116686 | A1 | 8/2002 | Shin et al. |
| 2002/0144224 | A1 | 10/2002 | Frerichs et al. |
| 2002/0162082 | A1 | 10/2002 | Cwynar et al. |
| 2002/0184606 | A1 | 12/2002 | Ohba et al. |
| 2003/0051217 | A1 | 3/2003 | Cheng |
| 2003/0084415 | A1* | 5/2003 | Sasaki et al. ............ 716/4 |
| 2003/0085715 | A1 | 5/2003 | Lubkeman et al. |
| 2003/0107134 | A1 | 6/2003 | Lee |
| 2003/0229479 | A1 | 12/2003 | Smith et al. |
| 2003/0229875 | A1 | 12/2003 | Smith et al. |
| 2004/0049754 | A1 | 3/2004 | Liao et al. |
| 2004/0098688 | A1 | 5/2004 | Vuong et al. |
| 2004/0158805 | A1 | 8/2004 | Kanamoto et al. |
| 2004/0237058 | A1* | 11/2004 | Teng et al. ............ 716/5 |
| 2005/0027491 | A1 | 2/2005 | Fertner et al. |
| 2005/0044520 | A1 | 2/2005 | Vuong et al. |

OTHER PUBLICATIONS

Chen, Y. et al. "Performance-Impact Limited Area Fill Synthesis" Proceedings of the 2003 Design Automation Conference (DAC '03), Anaheim, CA, Jun. 2-6, 2003, pp. 22-27.

Gupta, P. et al. "Manufacturing-Aware Physical Design" Proceedings of the 2003 International Conference on Computer Aided Design (ICCAD '03), San Jose, CA, Nov. 9-13, 2003, pp. 681-687.

Kahng, A.B. et al. "Filling and Slotting: Analysis and Algorithms" Proceedings of the 1998 International Symposium on Physical Design (ISPD 98), Monterey, CA, pp. 95-102.

Kurokawa, A. et al. "Efficient Capacitance Extraction Method for Interconnects with Dummy Fills" Proceedings of the IEEE 2004 Custom Integrated Circuits Conference, Orlando, FL, Oct. 3-6, 2004, pp. 485-488.

Lai, R.S. et al. "Steady State Analysis of the Symmetrical Push-Pull Power Converter Employing a Matrix Transformer", 21st Annual IEEE Power Electronics Specialist Conference, Jun. 11-14, 1990, pp. 347-354.

Le Coz, Y.L. et al. "A High-Speed Capacitance Extraction Algorithm for Multi-Level VLSI Interconnects", Eighth International IEEE VLSI Multilevel Interconnection Conference, Jun. 11-12, 1991, pp. 364-366.

Lee, K.H. et al. "Analyzing the Effects of Floating Dummy-Fills: From Feature Scale Analysis to Full-Chip RC Extraction" Proceedings of the 2001 International Electron Devices Meeting, IEDM Technical Digest, Washington, DC, Dec. 2-5, 2001, pp. 31.3.1-31.3.4.

Lee, W.S. et al. "Investigation of the Capacitance Deviation Due to Metal-Fills and the Effective Interconnect Geometry Modeling" Proceedings of the Fourth International Symposium on Quality Electronic Design (ISQED '03), San Jose, CA, Mar. 24-26, 2003, pp. 373-376.

Nelson, M. et al. "Optimizing Pattern Fill for Planarity and Parasitic Capacitance" Proceedings of the IEEE Conference and Workshop on Advanced Semiconductor Manufacturing (ASMC '04), Boston, MA, May 4-6, 2004, pp. 115-118.

Office Action dated Aug. 9, 2007 for U.S. Appl. No. 10/903,976.
Office Action dated Dec. 13, 2007 for U.S. Appl. No. 10/903,976.
Office Action dated Feb. 15, 2007 for U.S. Appl. No. 10/903,976.
Office Action dated Feb. 23, 2006 for U.S. Appl. No. 10/903,976.
Office Action dated Jan. 2, 2008 for U.S. Appl. No. 10/909,059.
Office Action dated Jan. 8, 2007 for U.S. Appl. No. 10/909,059.
Office Action dated Jul. 10, 2007 for U.S. Appl. No. 10/909,059.
Office Action dated Jul. 29, 2008 for U.S. Appl. No. 10/909,059.
Office Action dated Sep. 26, 2006 for U.S. Appl. No. 10/903,976.

Park, J.K. et al. "An Exhaustive Method for Characterizing the Interconnect Capacitance Considering the Floating Dummy-Fills by Employing an Efficient Field Solving Algorithm" Proceedings of the 2000 International Conference on Simulation of Semiconductor Processes and Devices (SISPAD 2000), Seattle, WA, Sep. 6-8, 2000, pp. 98-101.

Rukhlenko, A.S. "Change Distribution and Capacitance for Generalized Periodic SAW Transducers Using Floquet's Technique" Proceedings of 1994 IEEE Ultrasonics Symposium, vol. 1, Nov. 1-4, 1994, pp. 325-329.

Stine, B.E. et al. "The Physical and Electrical Effects of Metal-Fill Patterning Practice for Oxide Chemical-Mechanical Polishing Processes" IEEE Transactions on Electron Devices, Mar. 1998, vol. 45, No. 3, pp. 665-679.

Tian, R. et al. "Model-Based Dummy Feature Placement for Oxide Chemical-Mechanical Polishing Manufacturability" IEEE Transactions on Computer-Aided Design of Integrated Circuits and Systems, Jul. 2001, vol. 20, No. 7 pp. 902-910.

Yamaguchi, K. et al. "Capacitance Analysis of Devices with Electrically Floating Regions" Solid State Electronics, 2004, vol. 48, pp. 2115-2124.

Notice of Allowance dated Oct. 16, 2007 for U.S. Appl. No. 10/903,603.
Notice of Allowance dated Jun. 26, 2008 for U.S. Appl. No. 10/903,976.
Notice of Allowance dated Jan. 2, 2008 for U.S. Appl. No. 10/902,921.
Notice of Allowance dated Jan. 8, 2010 for U.S. Appl. No. 10/909,059.
Non-Final Office Action dated Oct. 15, 2010 for U.S. Appl. No. 12/786,325.
Notice of Allowance dated Apr. 18, 2011 for U.S. Appl. No. 12/786,325.

* cited by examiner

METHODS AND MECHANISMS FOR EXTRACTING AND REDUCING CAPACITOR ELEMENTS

CROSS-REFERENCE TO RELATED APPLICATIONS

This application is a divisional of U.S. patent application Ser. No. 10/902,921, filed on Jul. 30, 2004, which claims the benefit of U.S. Provisional Patent Application Ser. No. 60/491,934, filed on Aug. 1, 2003, the entire disclosures of which are expressly incorporated by reference herein.

BACKGROUND AND SUMMARY

Computer Aided Design (CAD) for electronic systems typically involves a sequence of steps, such as layout design where devices are placed and connecting conductors are routed, layout analysis where elements representing devices and interconnect are extracted, physical verification where circuit analysis and other analyses are performed using the extracted elements, and functional verification where the design is tested against specification.

Metal fill injection is a technique that is commonly used to enhance mechanical integrity and assure planarity of the deposited layers on an integrated circuit. In multi-layer ICs, metal fill is placed in sparsely populated regions. Without the support of metal fill, layers can sag, allowing conductors of different layers to get too close. The fill typically includes many pieces, with some attached to ground and some floating unattached to ground or any other conductor. Unattached conductors or metal fill will be called floaters (or floating conductors).

The layout record for integrated circuits (ICs) normally includes the locations, shapes, and sizes of the devices and connecting metal conductors, both regular conductors and metal fill conductors. From this information, capacitors between conductors are extracted for subsequent simulation and other verification analyses.

Therefore, the purpose of metal fill is mechanical, but since it is a conductor, it can also affect the electrical operation, in particular the capacitance between connecting conductors. It is desirable to be able to determine the set of capacitors resulting from the metal fill since ignoring the effects of metal fill on capacitance could lead to inaccurate calculations and subsequently, unreliable conclusions from simulation and other analyses that verify the integrated circuit.

However, placing too much information about the metal fill in the layout record or including nodes for metal fill in subsequent simulations that use the extracted capacitors could be disadvantageous. Including fill in the layout record and in simulators encumbers the designer and the computing resources. As there can be substantial numbers of fill pieces, extraction and simulation may not be possible within normal limits on memory and CPU time.

To address these problems, methods and mechanisms for implementing virtual metal fill are provided. In some embodiments, a software-based approach (referred to herein as Virtual-Metal-Fill or VMF) that accounts for the effect of metal fill on extracted capacitance without explicitly including fill in the layout record is provided. As metal fill can be used extensively in a design, the benefit to the designer is a vastly simplified operation. Moreover, VMF software simplifies the operation by consolidating metal-fill pieces whenever the capacitance between the connecting conductors is unaffected.

In some embodiments, the metal-fill data is inserted into the layout record according to rules, with parameters and options supplied by the designer. The rules govern the electrical nature (fill is either grounded or floating) and the geometry (the size, shape, and density) of the fill. Extraction from this augmented layout record delivers various kinds of capacitors: between pieces of metal fill, between regular conductors, and between metal fill and regular conductors. Reduction schemes allow fill nodes to be eliminated, yielding an equivalent set of capacitors, just between regular conductors. Thus, virtual metal fill accounts for metal fill implicitly: the software provides detailed placement information and the final set of capacitors do not involve metal fill nodes. Designers need only provide parameters and choices for the fill rules and need not include metal fill nodes in subsequent simulations.

Therefore, the present approach can extract capacitance between conductors that accounts for metal fill without encumbering the designer to include it in the layout or in simulations. Prior approaches could overload an extraction system, making it impossible to get all the capacitors or otherwise, to use them effectively in simulations.

BRIEF DESCRIPTION OF THE DRAWINGS

The drawings illustrate the design and utility of preferred embodiments of the present invention, in which similar elements are referred to by common reference numerals. In order to better appreciate how advantages and objects of the present inventions are obtained, a more particular description of the present inventions briefly described above will be rendered by reference to specific embodiments thereof, which are illustrated in the accompanying drawings. Understanding that these drawings depict only typical embodiments of the invention and are not therefore to be considered limiting its scope, the invention will be described and explained with additional specificity and detail through the use of the accompanying drawings.

DETAILED DESCRIPTION OF THE EMBODIMENTS

Figure 1:
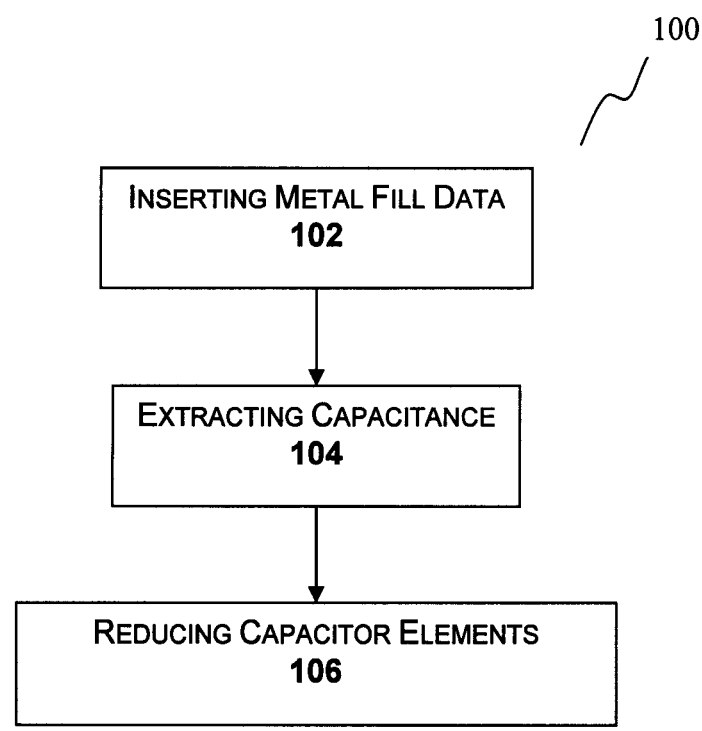
FIG. 1 illustrates a method of implementing virtual metal fill in accordance with embodiments of the invention.

Various embodiments of the present invention are described hereinafter with reference to the figures. It should be noted that the figures are not drawn to scale and that elements of similar structures or functions are represented by like reference numerals throughout the figures. It should also be noted that the figures are only intended to facilitate the description of specific embodiments of the invention. They are not intended as an exhaustive description of the invention or as a limitation on the scope of the invention. In addition, an illustrated embodiment needs not have all the aspects or advantages of the invention shown. An aspect or an advantage described in conjunction with a particular embodiment of the present invention is not necessarily limited to that embodiment and can be practiced in any other embodiments of the present invention even if not so illustrated.

FIG. 1 illustrates a method 100 for implementing virtual metal fill (VMF) in accordance with some embodiments of the invention. The method includes three steps: (1) metal fill data is inserted into a layout record based on a set of given rules to create an augmented layout record (step 102), (2) capacitance is extracted from the augmented layout record to create a capacitance network (step 104), and (3) the capacitance network is reduced by eliminating metal-fill nodes (step 106). Each of these steps can be carried out by several approaches. The rules can accommodate various shapes (e.g. quadrilaterals) and could be administered in a variety of ways. The extraction could be carried out by any field solver or extractor in a local or global mode. Several different numerical methods can be used to perform the reduction process. Any of the steps 102, 104, 106 can be combined with another of the steps 102, 104, 106. Also, in other embodiments, the order of the steps 102, 104, 106 can be different from that illustrated. Embodiments of the invention can be applied to any electronic system (e.g. ICs and printed wiring boards (PCBs)).

Rule-Based Metal Fill Data Insertion

In step 102 of the illustrated embodiments, metal-fill data is inserted into a layout record according to rules to create an augmented layout record. Each of the rules involves configuration choices, geometric parameters, and/or options for consolidating the fill. For example, the rule(s) may specify an electrical type (e.g., grounded or floating) of the fill and/or a geometry (e.g., location, shape, size, and density) of the fill. Examples of shapes could include square tiles or plates with evenly spaced rectangular holes, called "cheese". In some embodiments, cheese-type plates can be changed to plates and the tiles are combined into long columns. An empty region in a circuit should have a certain minimum size before metal fill data is inserted for the region.

In the illustrated embodiments, the rules that prescribe insertion of metal fill data into the layout record specify the electrical type of the injected nodes and/or geometrical shapes for each metal layer. In one approach, these can be specified as choices and parameters in a designated metal fill rules section of a process/technology file. In addition to, or instead of, placing these in a process/technology file, they can be specified as options and parameters in command lines and command option files. For example, the electrical type can be specified as either grounded (g) or floating (f), where floating indicates that the fill is unattached to ground or any other conductor. Grounded fillings are given the same net number as the ground node, while floating fillings are assigned new net numbers beyond the highest legitimate net number of the conductors when fill is absent. The new nets associated with the grounded fillings and the floating fillings are added to a NET file, which keeps track of the correspondence between net numbers and names for all the conductors.

In some embodiments, the regions in a metal layer where metal fill (as represented by the metal fill data) can be inserted can be kept in an edgefile (referred to as bb or bounded box), typically containing rectangles, trapezoids, other geometric shapes, and customized shapes. In some cases, parts of the region in file bb can be excluded from fillings by reference to another edgefile (referred to as exc).

When metal fillings are used that include regularly spaced square tiles or plates with regularly spaced square holes, the former is referred to herein as tiles (t) and the latter as cheese (c). Due to the fact that each piece of cheese fill is a connected region, it is part of the same net with the same voltage, in an electrical sense. Therefore, in some embodiments, each cheese piece can be simplified by eliminating the holes to become a solid plate, which may either be grounded or floating.

In some embodiments, the overall density and size of metal fill (as represented by the metal fill data) in the included region can be specified by three parameters (e.g., as given in the process file): tile width w, a minimum separation s of tiles from original conductors, and a separation d of adjacent tiles. For example, if two adjacent conductors are separated by a distance 2*s+w, then one tile of width w can be inserted halfway between them, with the tile being spaced a distance s from an edge of each conductor. If the separation is less, then no metal fill data is inserted. If the separation is more, a prescribed number or a maximum number of tiles will be inserted such that the conductors are separated at least s from the tiles. In other embodiments, shifts of the tiles are allowed so that one conductor may be closer to the tiles than the other. Also, in other embodiments, tiles may be assigned to slots derived from a reference tile that specifies a coordinate origin. In some embodiments, the inserted metal fill data represents tiles beyond end-conductors up to the edge of a chip boundary. In other embodiments, the overall density and size of metal fill in the included region can be specified by other parameters or other combination of parameters.

Figure 2:
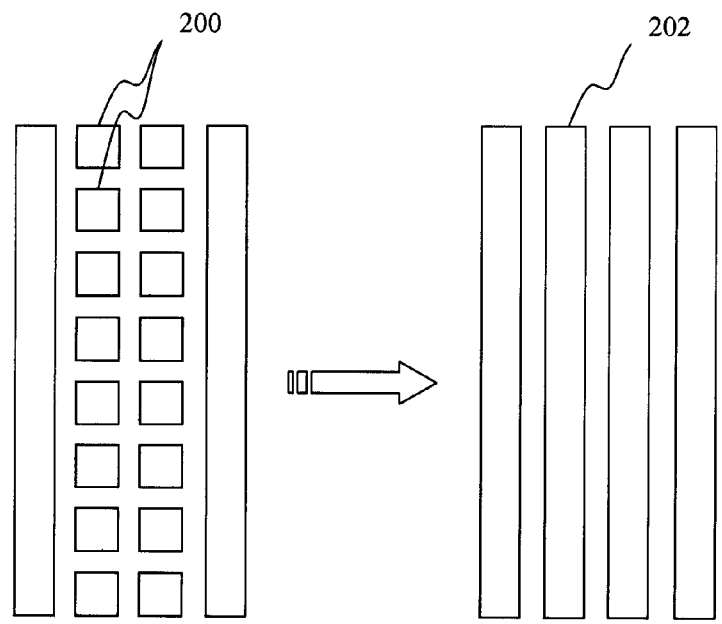
FIG. 2 is a diagram illustrating metal fill tiles being approximated by metal fill columns.

In some embodiments, the actual metal fill (metal fill to be included or implemented in a chip design) comprises tiles 200 (FIG. 2). To minimize the number of tiles 200 (e.g., those running along a conductor) in an analysis process, the inserted metal fill data can be processed (e.g., consolidated) to obtain a first processed metal fill data representing virtual metal fill having long, thin columns 202, thereby forming a single net. The effect of this consolidation on extracted capacitance is small because voltage varies insignificantly along conductors. In other embodiments, instead of processing the metal fill data to obtain the first processed metal fill data, the metal fill data being inserted already represents consolidated metal fill.

Figure 3:
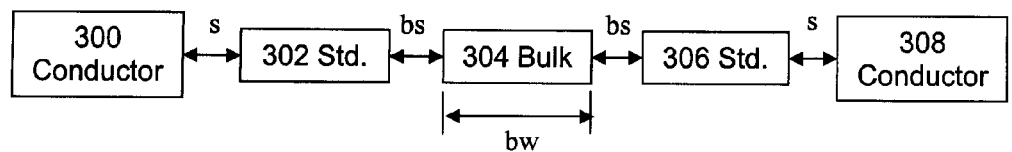
FIG. 3 is a diagram illustrating columns being combined.

In other embodiments, further consolidation can be performed by combining columns between conductors, which can be specified by options on the command line or in a command option file. One alternative is to combine many columns between conductors 300 into three columns: two standard columns 302, 306 and one bulk column 304 of width bw, as shown in FIG. 3. Separation bs between the standard and bulk columns can be chosen so that the total space, 2*(s+bs) (spacing between conductors 300, 308 that are not occupied by the columns 302, 304, 306), matches the total original spacing (spacing between conductors 300, 308 that are not occupied by the original tilings/columns), thereby rendering the capacitance of the resulting net to remain approximately the same as that before the columns are combined. Another alternative is to combine the columns into a single bulk column. In such cases, when the fill is grounded, the distance between the bulk and conductors 300, 308 should be preserved (e.g., at s) such that the resulting capacitance remains approximately the same. Also, in such cases, when the fill is floating, the total spacing (e.g., 2*s) should be preserved, as similarly discussed previously. A third alternative is to keep the original array-structure of the tiles.

In the above described embodiments, the columns 302, 304, 306 have similar length. However, the scope of the invention should not be so limited. In other embodiments, tiles can be consolidated into a tapering configuration, where columns in the middle are longer than those near the conductors. In further embodiments, tiles can be consolidated into other configurations. Although the above example has been described with reference to actual metal fill having tiles, in other embodiments, the actual metal fill can have other shapes and/or configurations. Also, instead of consolidating actual metal fill into virtual metal fill having columns, in other embodiments, the actual metal fill can be consolidated into other shapes and/or configurations. The consolidating can be performed before the metal fill data is inserted (in which case, the metal fill data being inserted represents consolidated metal fill) or after the metal fill data is inserted (in which case, the metal fill data being inserted represents actual metal fill or un-consolidated metal fill).

Capacitance Extraction

Referring back to FIG. 1, following the step 102 of inserting metal fill data, capacitance is extracted from the augmented layout (step 104). Different modes of extraction may be performed, e.g., shape mode or coefficient mode, depending on the kind of extraction that is desired. The shape mode is a more global approach and the coefficient mode is a more localized approach. The shape mode may be more accurate while the coefficient mode may be more efficient.

In the shape mode, a field solver is used to determine the total charge on the conductors produced by voltages imposed on the conductors to obtain the capacitor elements (or capacitance). A chip can be cut into multiple portions and processed a portion at a time by the field solver. For a more robust field solver, the entire chip may be processed as a whole. The extracted capacitors are then collected to form a capacitor network. In the illustrated embodiments, the capacitors are collected in a capacitance file that represents the capacitor network among different nets, where nets include both original conductors and the new metal fill.

After the capacitor network has been created, the capacitor network can then be reduced by computing an equivalent network of capacitors connecting only the original conductors, thereby eliminating metal-fill nets. For the grounded metal-fill net(s), the reduction can be accomplished by ignoring capacitors connected to the metal-fill net(s). In some embodiments, such capacitors are not extracted. For the floating metal-fill net(s), the reduction can be accomplished by enforcing the condition that floaters have zero charge. In other embodiments, the capacitor network can be reduced by assigning a non-zero value voltage or a non-zero charge to the metal fillings. Methods for reducing a capacitance network is described in further detail below.

In the "coefficient" mode, virtual metal fill (as represented by metal fill data) appears in patterns that represent local configurations of conductors on an integrated circuit. In this mode, the layout record is scanned and local configurations of conductors (including original conductors and new metal fill) are matched against standard/reference patterns. Two dimensional patterns can represent regions where the conductors are long, straight, and parallel, while three dimensional patterns can represent more complicated configurations such as orthogonal cross-overs in different layers. A field solver determines the total charge on the conductors of the patterns produced by voltages imposed on the conductors to get the capacitor elements. In the illustrated embodiments, capacitance values for the standard/reference patterns are calculated for sample dimensions and are stored in a coefficient table. The actual capacitance extraction (and reduction) is performed by identifying patterns in local regions of a chip, and looking up entries that correspond to the identified patterns in a lookup table. In some cases, a net can span a distance that is long relative to pattern sizes, and more than one patterns can contribute to a net capacitor.

Interpolation may be performed to handle actual variations in the configuration of conductor(s). As such, in the coefficient mode, extracted capacitance is determined by looking up values associated with predetermined patterns in a table; while in the shape mode, extracted capacitance is determined based on the actual configuration of the chip. In the coefficient mode, the values in the lookup table represents a collection of capacitor elements that has already been reduced. Methods for reducing a capacitance network will be described in further detail below.

Reduction

Referring to FIG. 1, after the capacitors have been extracted, the collection of the extracted capacitors is reduced by eliminating the nodes (or terminals) associated with metal fill (step 106). Metal fill in electronic structures complicates physical analysis when unattached to ground or other conductors. The number of these floating pieces can get quite large causing extracted capacitors to overload simulators used in physical verification. Capacitors extracted from layout can represent coupling between two regular conductors, between two floaters (free floating metal fills), or between a regular conductor and a floater. In the illustrated embodiments, the number of extracted capacitors is reduced (e.g., by eliminating the floating nodes/conductors) to create an equivalent set of capacitors that connect regular conductors only. The reduced collection of capacitors (e.g., as represented by a capacitance matrix) can be used to perform subsequent circuit simulation or other analyses.

Various techniques can be employed to eliminate floating nodes. In some embodiments, floating conductors (e.g., free floating metal fills) can be eliminated by enforcing a floating condition inside a field solver during the extraction step 104. In this approach, the set of capacitors is already in reduced form when they are extracted, with capacitors only between regular conductors. As such, the steps 104, 106 are combined—i.e., reduction is achieved while capacitance is extracted (in other words, extraction is performed in a way such that a reduction step is unnecessary). Performing reduction of capacitance inside a field solver can be efficient and accurate. This is particularly true when the whole structure is handled at once. In some cases, capacitors are extracted from small substructures, and their contributions are summed up (e.g., by virtue of the principle of superposition) to get final capacitance values. This principle may not apply when some conductors are floating and their voltages are different in different substructures. Thus, this approach may be more appropriate for structures that can be handled as one piece or structures that are reliably decomposed into substructures (thereby creating well-separated clusters of floating nodes).

In other embodiments, approximate approaches can be used. Some approximate approaches assign voltages to the floaters (e.g., by grounding the floaters, or by assigning voltages based on the voltages of the regular conductors). Another approximate approach uncouples capacitors between regular conductors and floaters, and adds some portion (e.g. 50% of the uncoupled capacitance) to the capacitance between the regular conductor(s) and ground. The approximate approaches are approximate, and are therefore, reliable only within certain bounds and/or conditions.

In some embodiments, the reduction step 106 is accomplished by performing matrix operation(s). In such cases, conductors are numbered consecutively (e.g., from 0 to N−1, or from 1 to N, wherein N represents a total number of conductors), thereby allowing voltages and charges of the conductors to be represented by vectors (V and Q, respectively). Particularly, the voltages are organized into a column vector V of length N with consecutive entries corresponding to voltages of consecutive conductors. For example, the voltage on conductor 3 is the third entry of the vector, denoted V(3). The charges are likewise organized into a vector Q.

Also, capacitance values are organized into a capacitance matrix (C), which relates charge Q and voltage V by the matrix equation C*V=Q, where "*" denotes matrix multiplication. A location in the capacitance matrix C gives terminal numbers that represent conductors to which a capacitor is attached, and a value in the capacitance matrix C represents an amount of capacitance for the capacitor. For example, a 2pf capacitor attached to conductors 3 and 4 is represented by 2pf at row 3 and column 4, denoted (3,4), and also 2pf at (4,3). Likewise, a capacitor joining conductors, with numbers i and j, has its capacitance at locations (i, j) and (j, i) of the capacitance matrix C. Capacitance can be expressed in a common unit, allowing matrix entries to be numbers only, with the unit understood.

In the capacitance matrix C, total capacitance values are placed on the main diagonal (where row and column numbers are the same) and off-diagonal entries (where row and column numbers are different) are given a negative sign. For example, the entry at (3, 3) is the sum of the capacitance of all capacitors attached to conductor 3, including ground, and the entry at (3, 4) and (4, 3) can be, for example, −2.0 pf.

An equivalent capacitance matrix relating charge and voltage on just the non-floaters can be derived by enforcing the condition that total charge on a floater is zero. The equivalent capacitance matrix is expressed in terms of sub-matrices, C1, C2, and C3, where C1 is associated with the portion of C relating to the non-floaters, and C2 is associated with the portion of C relating to the floaters and non-floaters, and C3 is associated with the portion of C relating to the floaters. The conductors are separated into floaters and non-floaters, with the voltage vector for the non-floaters denoted by V1, and the voltage vector for the floaters denoted by V2. Likewise, the charge vector for non-floaters is denoted by Q1, and charge vector for floaters is denoted by Q2. The above capacitance equation can be split into two equations involving sub-matrices C1, C2, and C3 of C:

$$C1*V1+C2'*V2=Q1$$

$$C2*V1+C3*V2=Q2.$$

The portion of C whose rows and columns correspond to non-floaters is C1, the portion of C whose rows and columns correspond to floaters is C3, the portion of C whose rows correspond to floaters and whose columns correspond to non-floaters is C2, and the portion whose rows correspond to non-floaters and whose columns correspond to floaters is C2'. As C is symmetric, C2' is a transpose of C2.

Floating conductors normally have zero charge. Enforcing the zero-charge condition by setting Q2 to zero in the second equation allows the floater voltages V2 to be determined. The solution is expressed in terms of the inverse of matrix C3, denoted inv(C3), by $$V2=-inv(C3)*C2*V1.$$

Substituting V2 into the first equation gives an equation relating voltages and charges of the non-floaters, $$(C1-C2'*inv(C3)*C2)*V1=Q1.$$

Thus, the matrix, Cred=C1−C2'*inv(C3)*C2 provides an equivalent set of capacitors that account for metal fill, and the floaters have been eliminated. In accordance with some embodiments of the invention, an algorithm is provided to compute Cred, which can then be converted back to a collection of capacitors by identifying off-diagonal entries with coupling capacitors and by summing the entries of rows, including the diagonal entry, to get the ground capacitors.

The matrix Cred can be calculated using standard routines. For example, the matrix inverse can be determined by matrix solvers found in Lapack, and matrix-multiplication is a standard operation that can be performed using existing software. Other techniques known in the art can be used to manage memory usage and run time when the number of floaters is significant.

In some embodiments, the calculation can be simplified by a Compression technique and/or Sparse-Matrix techniques. Particularly, the Compression technique reduces the calculation to a sequence of smaller, more manageable calculations, and the Sparse-Matrix techniques reduce the number of arithmetic operations by considering only non-zero entries of the matrix, thereby achieving practical CPU times and memory usage for large systems. Both techniques are based on the fact that most conductors have significant capacitance coupling to only a few other conductors, so that most column vectors comprising the capacitance matrix C have relatively few non-zero entries. Exceptions among the non-floaters are ground and possibly power lines, and exceptions among the floaters are large or long pieces that border many other conductors.

In the compression technique, floaters are partitioned into disjoint sets having negligible inter-coupling, resulting in a sequence of smaller, more manageable calculations per floater-set. Two floaters in the same set may or may not be joined by a capacitor, but always have a chain of capacitors connecting them through other conductors in the set. Two floaters in different sets are never joined by a capacitor. In terms of matrices, compression converts the capacitance matrix C into block-diagonal form when the conductors are ordered according to the disjoint sets, one set at-a-time. For example, if there are 5 floaters in set #1 and 8 floaters in set #2, then the first 5 rows (and columns) correspond to the floaters in set #1, the next 8 to the floaters in set #2, and so on. The reduction is carried out for each set independently. This technique is most effective when the disjoint sets are small and a measure of effectiveness is the maximum size of the sets. Maximum size tends to be controlled by the densely coupled floaters—the ones coupled to many other floaters. As such, to improve effectiveness, densely coupled floaters may be separated out and handled after the others have been processed.

When the size of a disjoint set of floaters is small (e.g. 10 or 20), then standard matrix routines provide efficient reduction. But for long strings or large blocks of floaters, the size can get quite large, and sparse-matrix techniques can be used. In such cases, reduction is performed per entry; using $$Cred(i,j)=C1(i,j)-(inv(C3)*C2(i))dot\ C2(j)$$

In this expression, C1(i, j) represents the ij entry of matrix C1 and C2(i) represents the ith column of matrix C2. The result of inv(C3)*C2(i) is another column vector, and the dot product with C2(j) gives the amount to be subtracted from the ij entry of C1. This formula is derived based on the fact that C2' is the transpose of C2, and based on standard properties of the dot product. The matrix operations needed to implement reduction are dot multiplication of two vectors, matrix multiplication of a vector by a matrix, and matrix inversion. Each is facilitated by sparse-matrix techniques.

Sparse vectors are advantageously represented by specifying the number N of non-zero entries and two arrays of length N, one for the non-zero values, the other for the indices of the corresponding locations. Sparse matrices are represented by their column vectors, which are represented by sparse vectors. The dot product of any vector with a sparse vector having N entries involves no more than N scalar multiplications; and matrix multiplication of any vector by a sparse matrix is performed as a sequence of dot products. The operation involving the matrix inverse (i.e. inv(C3)*C2(i)) is performed by solving the equation C3*X=C2(i) for the vector X. In accordance with some embodiments of the invention, the equation is solved by an iterative method involving successive matrix multiplication by the sparse matrix C3. This kind of approach is called a Krylov subspace method. A type of Krylov subspace method is Conjugate Gradient method, which uses successive matrix multiplications to get the solution of matrix equations (Ax=b) and subsequently, the inverse of the matrix. The matrix operations used in the Conjugate Gradient method are dot products, matrix multiplication, and sums of sparse vectors. The sum of a vector V (with N entries) and a vector U (with M entries) involves no more than M+N entries when using the sparse form. Implementing these operations with suitable sparse-matrix routines leads to substantial gains in efficiency, and for some very large problems, the sparse techniques actually enable the reduction.

The Krylov subspace method uses successive matrix-multiplication of vector C2(i) by matrix C3 to get closer approximations to V2, the vector of floater voltages, when non-floater i has voltage equal to one and the other non-floaters have voltage equal to zero. Each multiplication introduces new entries in the resulting vector, corresponding to interaction with more distant floaters. The path length from non-floater to the coupled floater measures this distance and is referred to as the hop-length.

An alternate embodiment of the algorithm would specify a maximum hop-length, and in solving for V2, would ground all floaters separated by more than the maximum number of hops. This procedure limits the size of the matrices to be inverted and is similar to the Conjugate Gradient method in the algorithm when the maximum number of iterations allowed matches the hop-length.

The formula for the reduced capacitance matrix was derived from the condition that floaters have zero charge. In some applications that charge may be non-zero, to represent initial conditions for the capacitors. The reduced matrix has exactly the same form in that case, but there is a corresponding set of initial charges on the non-floaters given by $$Q0 = -C2'^{*}inv(C3)^{*}Q2$$

Total charge on the non-floaters would then include the sum of two contributions:

$$Q1 = Cred^{*}V1 + Q0,$$

with the first term dependent on voltage, and the second term independent of voltage. The new contribution, Q0, can be calculated by techniques that are similarly discussed previously.

Although embodiments of the invention can be used in design and analysis of integrated circuits, they also have applications to printed circuit boards (PCBs) and other electronic systems where capacitance is important and some conductors are floating. As illustrated, the embodiments of the invention achieve reliable results by implementing an exact form of the reduced capacitance matrix, and can handle very large systems because compression and sparse-matrix techniques provide the needed efficiency. In some embodiments, the methods described herein can be implemented as computer software (referred to herein as rmfloat). The software can be written in the C language using dynamic memory allocation to allow sizing memory during an execution. The command line to invoke the program can be as follows:
rmfloat [options] [floater options] [-n netfile] [-cgnd ground_name] icapfile ocapfile This command takes a capfile (icapfile) specifying an original set of capacitors and calculates an output capfile (ocapfile) specifying a set of capacitors with the floaters eliminated. Capacitors in a capfile are specified, per line, by conductor numbers of the two terminals that they are attached to and the value or capacitance of the capacitor. Conductor names and numbers are related in netfile and the name of the ground conductor is given by ground_name. There are three ways to specify conductor numbers of the floaters: by edge files, by ascii file, or by using numbers equal to or greater than a specified number. The other option simply calls for a final accounting of cpu and memory usage.

The software begins by reading the command line and checking for correctness. It checks that the input capfile is present, that ground_name exits in netfile, and that the floaters are correctly specified. For example, the ground conductor should not be a floater. To keep track of the floaters, an integer array float_net assigns one to entries associated with floaters and zero to entries associated with non-floaters. Also, the icapfile is prepared/processed to be read, and the ocapfile is prepared/processed for writing data.

The capacitor records are read from icapfile. If both terminals of a capacitor are not floaters, then the record is immediately written to ocapfile because it will be unaffected by the reduction process. If both terminals are floaters, then a connection is established between the two conductors. Specifically, each conductor is assigned the conductor number of another conductor in an integer array called parent; two conductors are connected if, in effect, they have a common root or ancestor. The parent array is processed by standard routines, called union-find (cf. M. A. Weiss, "Problem Solving Using C++", $2^{nd}$ Edition, Chapter 24), and leads to a final compression where the floaters are partitioned into disjoint, connected sets. Also, for each conductor, the sum of the capacitance of all attached capacitors is calculated and stored in an array called diag for later use. Memory is allocated for the parent, diag, and float_net arrays based on maxnet, the highest conductor number given in netfile.

The capacitance records are partitioned into disjoint sets based on the partitioning of the floaters. For a particular capacitor, if one of its terminals is a floater, then the record is associated with the corresponding float-set; if both terminals are floaters, they are associated with the same float-set; and if neither terminal is a floater, the capacitor would have been already written into ocapfile. The reduction is carried out independently for each float-set, and the results for each are written to ocapfile.

For each float set, the capacitance records are read twice. In the first pass, the floating and non-floating terminals are counted and assigned their own consecutive numbers. A mapping is established that translates these numbers to the originals for subsequent writing to ocapfile. The memory required for each column of the sub-matrices C2 and C3, is determined and allocated as a sparse vector. In the second pass, the columns are filled: columns in C2 when one of the two terminals is floating and in C3 when both terminals are floating. The reduction algorithm is carried out as matrix operations on these matrices.

The reduced matrix has the form $$C1 - C2'^{*}inv(C3)^{*}C2$$

The first term C1, having capacitance between non-floating conductors, is separated out initially. The second term is calculated for each float-set, one entry at a time. Entry (i, j) is calculated as $$X \mathrm{dot} C2(j),$$

where X is the solution vector of the matrix equation, $$C3^{*}X = C(i).$$

Here i and j denote numbers for non-floating conductors, C2(i) and C2(j) denote the corresponding column vectors of C2, "*" denotes matrix multiplication, and "dot" denotes the dot product of two vectors. The vectors are stored in sparse form, where the value of an entry and its location are stored in separate arrays. Routines for the dot product and matrix multiplication take advantage of the sparse form for maximum efficiency. The matrix equation is solved by the Conjugate Gradient method, an iterative method which uses successive matrix multiplication of C2(i) by C3 to get increasingly close approximations to the solution (cf. Golub and Loan, "Matrix Computations", Chapter 8). When the C2 and C3 matrices are small, the matrix inverse can be calculated by dgels in the Lapack library of mathematical routines and the rest by standard operations. Lapack routines are direct methods (i.e., instead of iterative methods) that can be used to implement matrix operations. Such routines may be useful for handling patterns in which the number of conductors is relatively small, but can also be used to handle large number of conductors as well.

Individual capacitors are determined from the entries of the reduced matrix. For integers i<j, the entry at row i and column j is written to ocapfile if it is greater than a certain prescribed percentage of the diagonal entries at i and j; otherwise, it is regarded as inessential and eliminated to simplify the output. For example, if the prescribed threshold is 10%, then a capacitor between conductors 3 and 4 is written to ocapfile if its capacitance exceeds 10% of either the total capacitance for conductor 3 or for conductor 4. From the main diagonal, an entry at row i is summed with the other entries of the row to give the capacitance between conductor i and ground, and this is written to ocapfile. The output file is the final result coming from rmfloat.

There are two alternatives to the operation of rmfloat. If the number of floaters in a float-set exceeds a specified float limit, then a simplified calculation is performed, where capacitors between floaters and non-floaters are replaced by capacitors from the non-floater to ground with half the capacitance value. In some embodiments, the default limit is 1,000,000. If some floating conductors are attached to too many other floaters, then they are temporarily removed from the list of floaters and are eliminated in a separate pass. As a result, the compression tends to produce more, smaller float-sets that are handled more efficiently and the multi-connected floaters are handled more efficiently at the end of the reduction process.

As discussed previously, in the coefficient mode, values in the capacitance lookup table represents a collection of capacitor elements that are already reduced. In the coefficient mode, the capacitors for a set of patterns are first determined for various parameter values. The patterns include regular conductors and metal fill. After the capacitances of a pattern are computed, then the collection is reduced, eliminating the floating nodes. The reduced set of capacitances is stored in a table, one set for each pattern, for each choice of parameters. One of the inputs to the calculation of capacitances is the technology file, which specifies the layer structure of the chip (e.g., the thickness of the various layers, the dielectric constants for the dielectrics). The table can be applied to specific chips constructed in accord with the technology file by fitting the patterns to the configurations in local regions, then adding the pre-computed capacitances to the specific nets found in that region. At the end of scanning the entire chip, all nets are accounted for and the final capacitance values may be the summation of capacitances from many patterns, identified all over the chip.

For example, in some embodiments, a virtual metal fill (VMF) software can be provided that inserts metal fill data into patterns according to the rules described previously. The pattern may include five (5) conductors over a ground plane, but a more complicated pattern may have up to fifteen (15) conductors, placed in several layers. The field solver calculates the capacitance matrix for the pattern. Then, the capacitance file is reduced in accordance with the embodiments described previously. In some cases, if the size of the patterns is relatively small, there is no need of special numerical techniques to carry out the reduction. With floating nodes eliminated after reduction, the size of the capacitance table should remain the same as before. After the capacitance table has been determined, the extraction and reduction of capacitor elements can be performed, as discussed previously.

For both the shape mode and the coefficient mode, a capacitance file is created that reflects the effects of metal fillings in an efficient manner.

System

Figure 4:
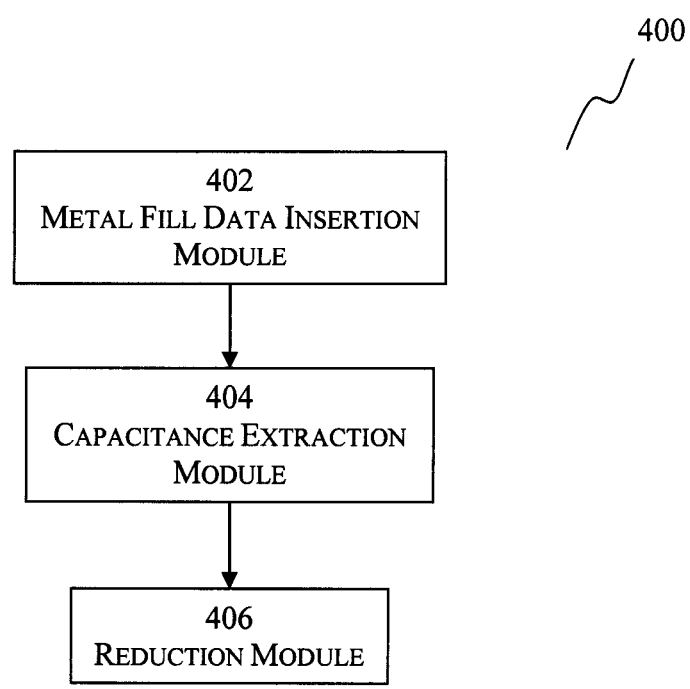
FIG. 4 illustrates a system of implementing virtual metal fill in accordance with embodiments of the invention.

FIG. 4 shows a block diagram of a system 400 in accordance with some embodiments of the invention. The system 400 includes a metal fill data insertion module 402 for inserting metal fill data into a layout record, a capacitance extraction module 404 for extracting capacitance, and a reduction module 406 for reducing extracted capacitance. Although the metal fill data insertion module 402, the capacitance extraction module 404, and the reduction module 406 are illustrated as separate components, in alternative embodiments, one or more of these modules 402, 404, 406 can be combined with another one of the modules 402, 404, 406. Also, in other embodiments, any of the modules 402, 404, 406 can have subcomponents to perform different functions described herein. Further, in other embodiments, the system 400 does not include all of the modules 402, 404, 406. For example, in other embodiments, the system 400 can include only one or two of the modules 402, 404, 406. Any or a combination of the modules 402, 404, 406, or any or a combination of subcomponents of any of the modules 402, 404, 406, can be implemented using software, hardware, or combination thereof.

Computer Architecture

Figure 5:
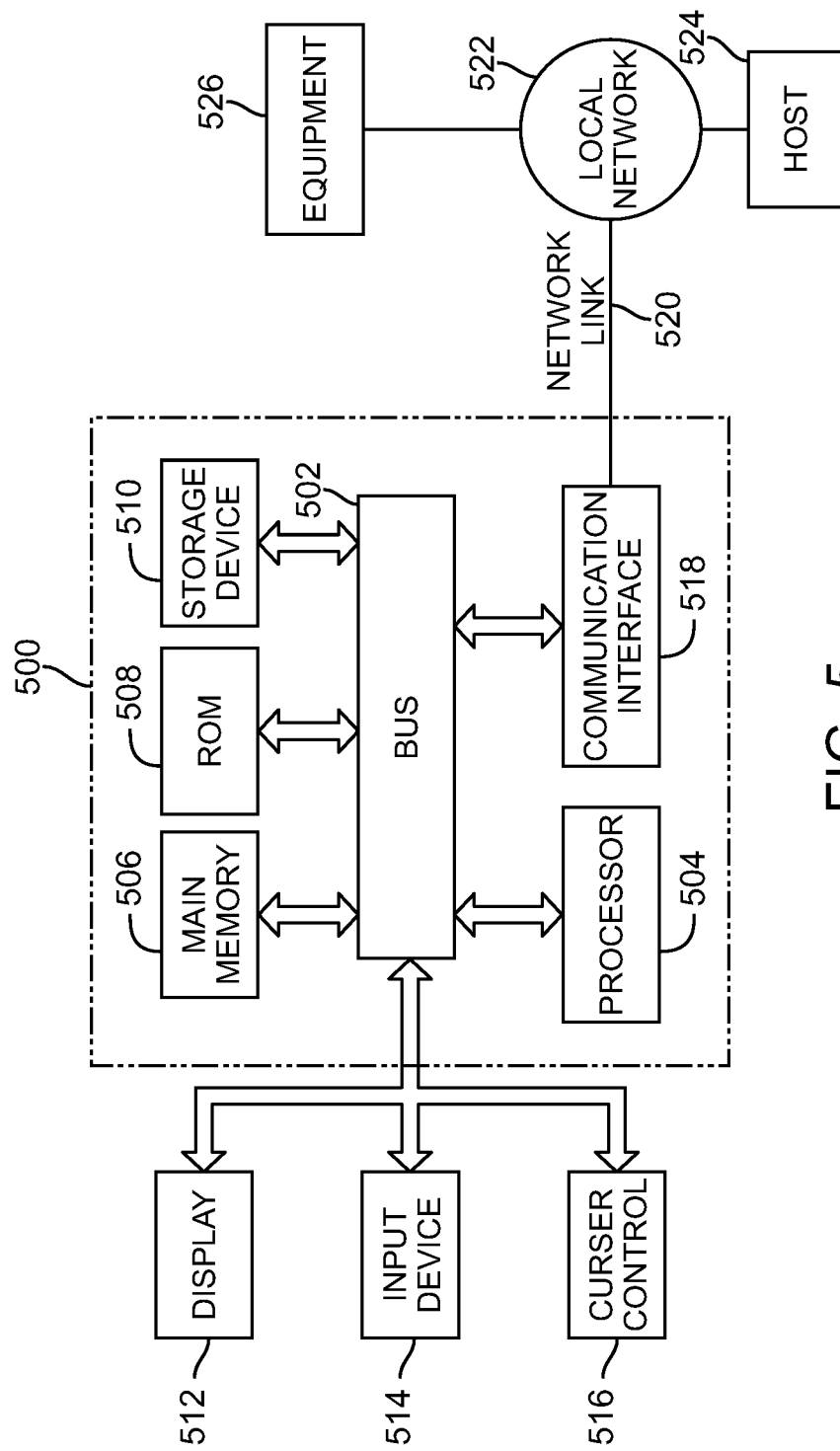
FIG. 5 is a diagram of a computer hardware system with which embodiments of the present invention can be implemented.

FIG. 5 shows an example of an embodiment of a block diagram of a computer system 500 that can be used to implement embodiments of the invention described herein. Particularly, the computer system 500 can store and execute a computer software program for performing any of the functions or steps described herein. The computer system 500 includes a bus 502 or other communication mechanism for communicating information, and a processor 504 coupled with the bus 502 for processing information. The computer system 500 also includes a main memory 506, such as a random access memory (RAM) or other dynamic storage device, coupled to the bus 502 for storing information and instructions to be executed by the processor 504. The main memory 506 also may be used for storing temporary variables or other intermediate information during execution of instructions to be executed by the processor 504. The computer system 500 further includes a read only memory (ROM) 508 or other static storage device coupled to the bus 502 for storing static information and instructions for the processor 504. A data storage device 510, such as a magnetic disk or optical disk, is provided and coupled to the bus 502 for storing information and instructions.

The computer system 500 may be coupled via the bus 502 to a display 512, such as a cathode ray tube (CRT), for displaying information to a user. An input device 514, including alphanumeric and other keys, is coupled to the bus 502 for communicating information and command selections to processor 504. Another type of user input device is cursor control 516, such as a mouse, a trackball, or cursor direction keys for communicating direction information and command selections to processor 504 and for controlling cursor movement on display 512. This input device typically has two degrees of freedom in two axes, a first axis (e.g., x) and a second axis (e.g., y), that allows the device to specify positions in a plane.

Embodiments of the invention are related to the use of computer system 500 for implementing virtual metal fills. According to one embodiment of the invention, such use is provided by computer system 500 in response to processor 504 executing one or more sequences of one or more instructions contained in the main memory 506. Such instructions may be read into the main memory 506 from another computer-readable medium, such as storage device 510. Execution of the sequences of instructions contained in the main memory 506 causes the processor 504 to perform the process steps described herein. One or more processors in a multi-processing arrangement may also be employed to execute the sequences of instructions contained in the main memory 506. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to the processor 504 for execution. Such a medium may take many forms, including but not limited to, non-volatile media, volatile media, and transmission media. Non-volatile media includes, for example, optical or magnetic disks, such as the storage device 510. Volatile media includes dynamic memory, such as the main memory 506. Transmission media includes coaxial cables, copper wire and fiber optics, including the wires that comprise the bus 502. Transmission media can also take the form of acoustic or light waves, such as those generated during radio wave and infrared data communications.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer-readable media may be involved in carrying one or more sequences of one or more instructions to the processor 504 for execution. For example, the instructions may initially be carried on a magnetic disk of a remote computer. The remote computer can load the instructions into its dynamic memory and send the instructions over a telephone line using a modem. A modem local to the computer system 500 can receive the data on the telephone line and use an infrared transmitter to convert the data to an infrared signal. An infrared detector coupled to the bus 502 can receive the data carried in the infrared signal and place the data on the bus 502. The bus 502 carries the data to the main memory 506, from which the processor 504 retrieves and executes the instructions. The instructions received by the main memory 506 may optionally be stored on the storage device 510 either before or after execution by the processor 504.

The computer system 500 also includes a communication interface 518 coupled to the bus 502. The communication interface 518 provides a two-way data communication coupling to a network link 520 that is connected to a local network 522. For example, the communication interface 518 may be an integrated services digital network (ISDN) card or a modem to provide a data communication connection to a corresponding type of telephone line. As another example, the communication interface 518 may be a local area network (LAN) card to provide a data communication connection to a compatible LAN. Wireless links may also be implemented. In any such implementation, the communication interface 518 sends and receives electrical, electromagnetic or optical signals that carry data streams representing various types of information.

The network link 520 typically provides data communication through one or more networks to other devices. For example, the network link 520 may provide a connection through local network 522 to a host computer 524 or to another equipment 526. The data streams transported over the network link 520 can comprise electrical, electromagnetic or optical signals. The signals through the various networks and the signals on the network link 520 and through the communication interface 518, which carry data to and from the computer system 500, are exemplary forms of carrier waves transporting the information. The computer system 500 can send messages and receive data, including program code, through the network(s), the network link 520, and the communication interface 518.

Although particular embodiments of the present inventions have been shown and described, it will be understood that it is not intended to limit the present inventions to the preferred embodiments, and it will be obvious to those skilled in the art that various changes and modifications may be made without departing from the spirit and scope of the present inventions. The specification and drawings are, accordingly, to be regarded in an illustrative rather than restrictive sense. The present inventions are intended to cover alternatives, modifications, and equivalents, which may be included within the spirit and scope of the present inventions as defined by the claims.

What is claimed is:

1. A computer implemented method of extracting capacitance from a layout record, comprising:
    using at least one processor to performing a process, the process comprising:
    selecting a mode of extraction for extracting capacitance from a layout record, the mode of extraction comprises a first mode of extraction or a second mode of extraction, wherein
        the first mode of extraction provides greater accuracy than the second mode, and
        the second mode provides better efficiency than the first mode; and
    determining a capacitor element by imposing a voltage on a conductor to determine a total charge on or a capacitance value of the conductor based at least in part upon whether virtual metal fill is used for the mode of extraction, in which the virtual metal fill accounts for an electrical effect of an actual conductor in the layout record without including one or more shapes corresponding to the virtual metal fill in the layout record;
    imposing voltages on a plurality of conductors in the layout record and determining a total charge for each of the plurality of conductors, wherein the first mode of extraction is selected; and
    extracting the capacitance from the layout record based at least in part on the mode of extraction that has been selected.

2. The computer implemented method of claim 1, further comprising dividing a circuit design in the layout record into portions, wherein the conductors on which the voltages are imposed are associated with one of the portions.

3. The computer implemented method of claim 1, wherein the conductors on which the voltages are imposed are associated with an entire chip design in the layout record.

4. The computer implemented method of claim 1, wherein the second mode is selected, and the process further comprises:
   matching a configuration of conductors in the layout record against a reference pattern; and
   determining an extracted capacitance for the conductors based at least in part on the reference pattern.

5. The computer implemented method of claim 4, wherein the action of determining the extracted capacitance is performed by looking up a table having capacitance values for the reference pattern.

6. The computer implemented method of claim 4, wherein the action of determining the extracted capacitance comprises determining a total charge on conductors for the reference pattern.

7. A computer program product comprising a non-transitory computer accessible medium having stored thereupon a set of stored instructions which, when executed by at least one processor, causes the at least one processor to perform a method, the method comprising:
   providing a user interface for selecting a mode of execution that comprises a first mode of execution or a second mode of extraction for extracting capacitance from a layout record, wherein
      the first mode of extraction provides greater accuracy than the second mode, and
      the second mode provides better efficiency than the first mode; and
   determining a capacitor element by imposing a voltage on a conductor to determine a total charge on or a capacitance value of the conductor based at least in part upon whether virtual metal fill is used for the mode of extraction, in which the virtual metal fill accounts for an electrical effect of an actual conductor in the layout record without including one or more shapes corresponding to the virtual metal fill in the layout record;
   imposing voltages on a plurality of conductors in the layout record and determining a total charge for each of the plurality of conductors, wherein the first mode of extraction is selected; and
   extracting the capacitance from the layout record based at least in part on the mode of extraction that has been selected.

8. The computer program product of claim 7, wherein the extracting comprises:
   matching a configuration of conductors in layout record against a reference pattern; and
   determining an extracted capacitance for the conductors based at least in part on the reference pattern.

9. A system for extracting capacitance from a layout record, comprising:
   at least one processor that is to:
   select a mode of extraction for extracting capacitance from a layout record, the mode of extraction comprises a first mode of extraction or a second mode of extraction, wherein
      the first mode of extraction provides greater accuracy than the second mode, and
      the second mode provides better efficiency than the first mode; and
   determine a capacitor element by imposing a voltage on a conductor to determine a total charge on or a capacitance value of the conductor based at least in part upon whether virtual metal fill is used for the mode of extraction, in which the virtual metal fill accounts for an electrical effect of an actual conductor in the layout record without including one or more shapes corresponding to the virtual metal fill in the layout record;
   imposing voltages on a plurality of conductors in the layout record and determining a total charge for each of the plurality of conductors, wherein the first mode of extraction is selected; and
   extracting the capacitance from the layout record based at least in part on the mode of extraction that has been selected.

10. The system of claim 9, wherein the at least one processor is further to:
   match a configuration of conductors in a layout record against a reference pattern; and
   determine an extracted capacitance for the conductors based at least in part on the reference pattern.

* * * * *